(12) United States Patent
Lin et al.

(10) Patent No.: US 8,008,171 B2
(45) Date of Patent: Aug. 30, 2011

(54) METHOD OF FABRICATING POLYCRYSTALLINE SEMICONDUCTOR

(75) Inventors: Chiung-Wei Lin, Taipei (TW); Yi-Liang Chen, Taipei (TW)

(73) Assignees: Tatung Company, Taipei (TW); Tatung University, Taipei (TW)

( * ) Notice: Subject to any disclaimer, the term of this patent is extended or adjusted under 35 U.S.C. 154(b) by 155 days.

(21) Appl. No.: 12/155,697

(22) Filed: Jun. 9, 2008

(65) Prior Publication Data

US 2009/0137104 A1    May 28, 2009

(30) Foreign Application Priority Data

Nov. 26, 2007   (TW) .............................. 96144736 A (51) Int. Cl.
*H01L 21/20* (2006.01)

(52) U.S. Cl. ........ 438/486; 438/502; 438/509; 438/530; 438/532; 438/660; 438/661; 438/662; 438/663; 257/E21.077; 257/E21.333; 257/E21.324; 257/E21.497

(58) Field of Classification Search .................. 438/486, 438/502, 509, 530, 532, 660, 661, 662, 663; 257/E21.077, E21.333, E21.324, E21.497
See application file for complete search history.

(56) References Cited

U.S. PATENT DOCUMENTS

| 5,358,574 | A  | * | 10/1994 | Sopori .......................... 438/71 |
| 6,277,714 | B1 | * | 8/2001  | Fonash et al. ................ 438/486 |
| 6,642,092 | B1 | * | 11/2003 | Voutsas et al. ............... 438/166 |
| 2004/0253797 | A1 | * | 12/2004 | Huang et al. .................. 438/486 |

* cited by examiner

*Primary Examiner* — Benjamin Sandvik
*Assistant Examiner* — Farid Khan
(74) *Attorney, Agent, or Firm* — Muncy, Geissler, Olds, & Lowe, PLLC (57) ABSTRACT

Disclosed is a method of providing a poly-Si layer used in fabricating poly-Si TFT's or devices containing poly-Si layers. Particularly, a method utilizing at least one metal plate covering the amorphous silicon layer or the substrate, and applying RTA (Rapid Thermal Annealing) for light illuminating process, then the light converted into heat by the metal plate will further be conducted to the amorphous silicon layer to realize rapid thermal crystallization. Thus the poly-Si layer of the present invention is obtained.

10 Claims, 16 Drawing Sheets

METHOD OF FABRICATING POLYCRYSTALLINE SEMICONDUCTOR

BACKGROUND OF THE INVENTION

1. Field of the Invention

The present invention relates to a method of fabricating a poly-silicon layer and, more particularly, to a method using a Rapid Thermal Annealing (RTA) process.

2. Description of Related Art

Poly-Si (poly-silicon) has superior electrical properties over amorphous silicon (a-Si) as well as the advantage of lower cost than the single silicon crystal. Therefore, it has received a lot of attention in the field of TFT productions recently. Also, poly-Si has played an important role in the application of TFT liquid crystal displays (LCD).

However, the grain size of poly-Si has a great limitations on the electron mobility and device properties. In particular, the grain boundaries existing in poly-Si will be an obstacle for the charge carriers in the device when passing through the gate channel. Therefore, how to enlarge the grain size of poly-Si and thus reduce the number of grain boundaries for enhancing the TFT device properties is an important trend in the poly-Si thin film fabrication technology nowadays. Take the display technology as an example, it is an urgent need to produce highly-efficient TFT's in order to develop better flat-panel displays.

As in U.S. Pat. No. 6,642,092, to Voutsas et al., a method is disclosed of providing a poly-Si component on a metal substrate by using a solid phase crystallization (SPC) annealing process. However, the method is not suitable to be used in providing flat panel displays because the metallic substrate cannot allow light transmission (e.g. backlight transmittance). Also, in the patent of WO2007064087, UM PYUNG-YONG et al. proposes a method using chemical vapor deposition (CVD) to produce poly-Si. The granules sizes of the poly-Si obtained from the both above methods are very small, the diameter is merely about 100 nm, thus the characteristic of the poly-Si layers formed by the above methods is not good enough for flat panel display manufacture.

Currently, the most commonly used method in fabricating the poly-Si thin film is the excimer laser annealing technology. Although a grain size of about 600 nm can be achieved in this case, it is still insufficient for making high-performance flat-panel displays. Therefore, a metal-induced lateral crystallinity (MILC) method was disclosed in TW256,733. The method uses metal, such as nickel, as an inducing material under high temperature and over a long period of time to grow poly-Si. Hence, it is time consuming and the problem of metal pollution will further exist.

Therefore, a solution of solving the above problems of preparing poly-Si, i.e. excessively time consuming, high temperature processing, limitation of the substrate material, pollution from the metal substrate, is an urgent important need. Also, the method of growing a poly-Si with large granule size, high crystallinity, low pollutant, and excellent electrical characteristic will be the main target for the present researchers.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

Therefore, the present invention has been made in view of the above-mentioned problems. An objective of the invention is to provide a method of fabricating poly-Si thin film used in fabricating poly-Si TFT's or devices containing poly-Si thin films. This method utilizes a metal plate (or two metal plates) covering the amorphous silicon layer or the substrate, applying RTA (Rapid Thermal Annealing) for a light illuminating process, then the light converted into heat by the metal plate will further be conducted to the amorphous silicon layer to realize rapid thermal crystallization. Thus, the poly-Si layer of the present invention is obtained.

In accordance with the above objective, the present invention provides a method of fabricating a poly-Si thin film, which comprises: (A) providing a substrate; (B) forming an amorphous-Si layer on a surface of the substrate; (C) attaching at least one metal plate, thus forming a stack; (D) light-illuminating to the stack, thus forming a poly-Si layer from the amorphous-Si layer; and (E) removing the metal plate to get a poly-Si layer. Wherein, a Rapid Thermal Annealing (RTA) process is applied in the light-illuminating process of the step (D) in order to shorten the heating time.

According to the present invention, the metal plates of step (C) can attach to the side of the amorphous-Si layer, the side of the substrate, or both sides of the amorphous-Si layer and the substrate. The applying of metal plates to both sides of the stack is able to accelerate the speed of heat conducting, thus shortening the process time, reducing the process temperature, and decreasing the energy consuming without disrupting the crystallinity of silicon.

According to the present invention, an infrared light or an ultraviolet light is preferably applied in the Rapid Thermal Annealing (RTA) process.

According to the present invention, the material of the metal plate is not limited but preferably is selected from the group consists of: Al, Fe, Cu, Ag, Mn, Co, Ni, Au, Zn, Sn, In, Cr, Pt, W, and the alloy thereof.

According to the present invention, the time of light-illuminating in step (D) is not limited but preferably is less than 120 seconds.

According to the present invention, the temperature of light-illuminating in step (D) is not limited but preferably is at 400-1100° C.

According to the present invention, the material of the metal plate is not limited but preferably is selected from the group consisting of: Al, Fe, Cu, Ag, Mn, Co, Ni, Au, Zn, Sn, In, Cr, Pt, W, and the alloy thereof.

The method of the present invention uses at least one metal plate covering on one side of the amorphous-Si layer or on one side of the substrate (or both sides of the amorphous-Si layer and the substrate), and uses Rapid Thermal Annealing (RTA) process for light illuminating, converts light into heat and then transfers the heat to the amorphous-Si layer by the metal plates to obtain rapid heating crystallization. Comparing to the prior methods, which are time consuming, i.e. need over 12 hours of heating time, and also need expensive high-temperature resistance material (e.g. quartz) as substrate, the method of the present invention is beneficial in process time reducing, i.e. the heating time is less than 120 seconds, and a general glass substrate or a low-melting-point substrate can be used with no concern. Therefore, the advantage of the method of the present invention is economical and practical for the providing of poly-Si layer.

The present invention will be apparent from the following detailed description.

Figure 1:
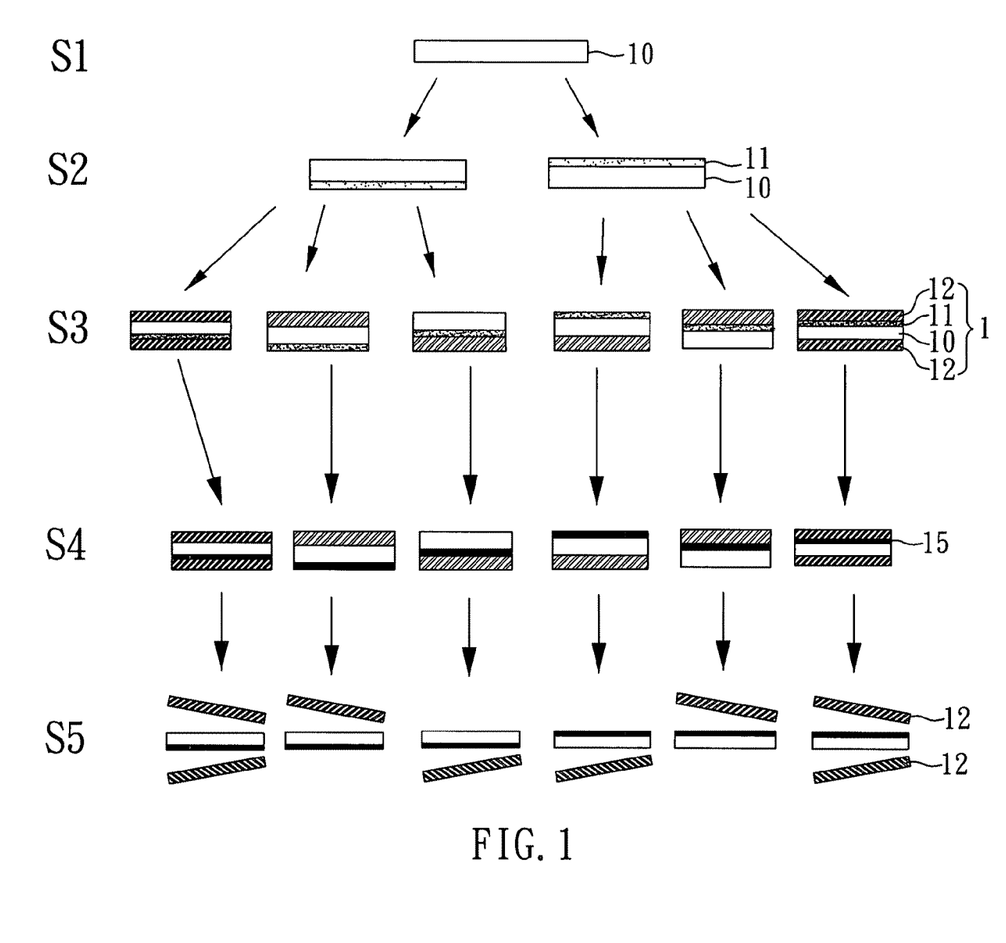
FIG. 1 is the process flow-chart of the method of the present invention.

With reference to FIG. 1, which indicates the process flow-chart of the method of the present invention, the method of the present invention comprises steps S1-S5, wherein S1 represents providing a substrate 10, S2 represents forming an amorphous-Si layer 11 on the substrate 10, S3 represents attaching one metal plate 12 (or two metal plates 12 to obtain better crystalinity), S4 represents applying Rapid Thermal Annealing (RTA) process to form a poly-Si layer 15 from the amorphous-Si layer 11, and S5 represents removing the metal plate 12.

Example 1

Figure 2:
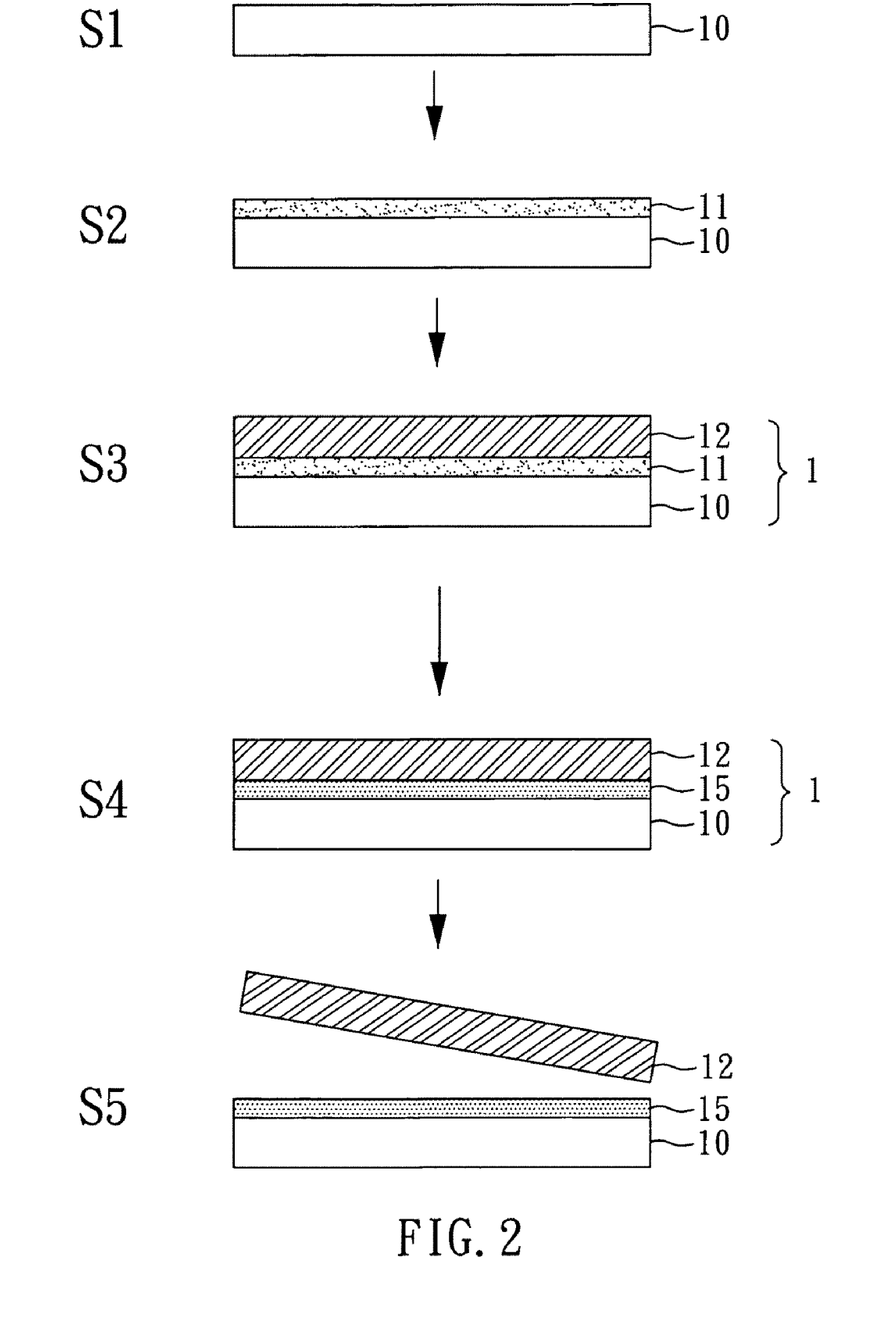
FIG. 2 is the process flow-chart of the method of fabricating a poly-Si layer in Example 1.

Referring to FIG. 2, which indicates the process flow-chart of the present example, first, an amorphous-Si layer 11 is formed on the glass substrate 10 (S2), a metal plate 12 is then applied to cover (attach) on the side of the amorphous-Si layer 11 to form a stack 1 (S3). Then, the whole stack 1 is placed into a Rapid Thermal Annealing (RTA) system (not shown) and illuminated with infrared light to obtain rapid heating (at 900° C., 106 seconds), and followed with annealing (S4). Therefore, the amorphous-Si layer 11 is crystallized into a poly-Si layer 15. Finally, the metal plate 12 is removed to get the poly-Si layer 15 (S5).

Example 2

Figure 3:
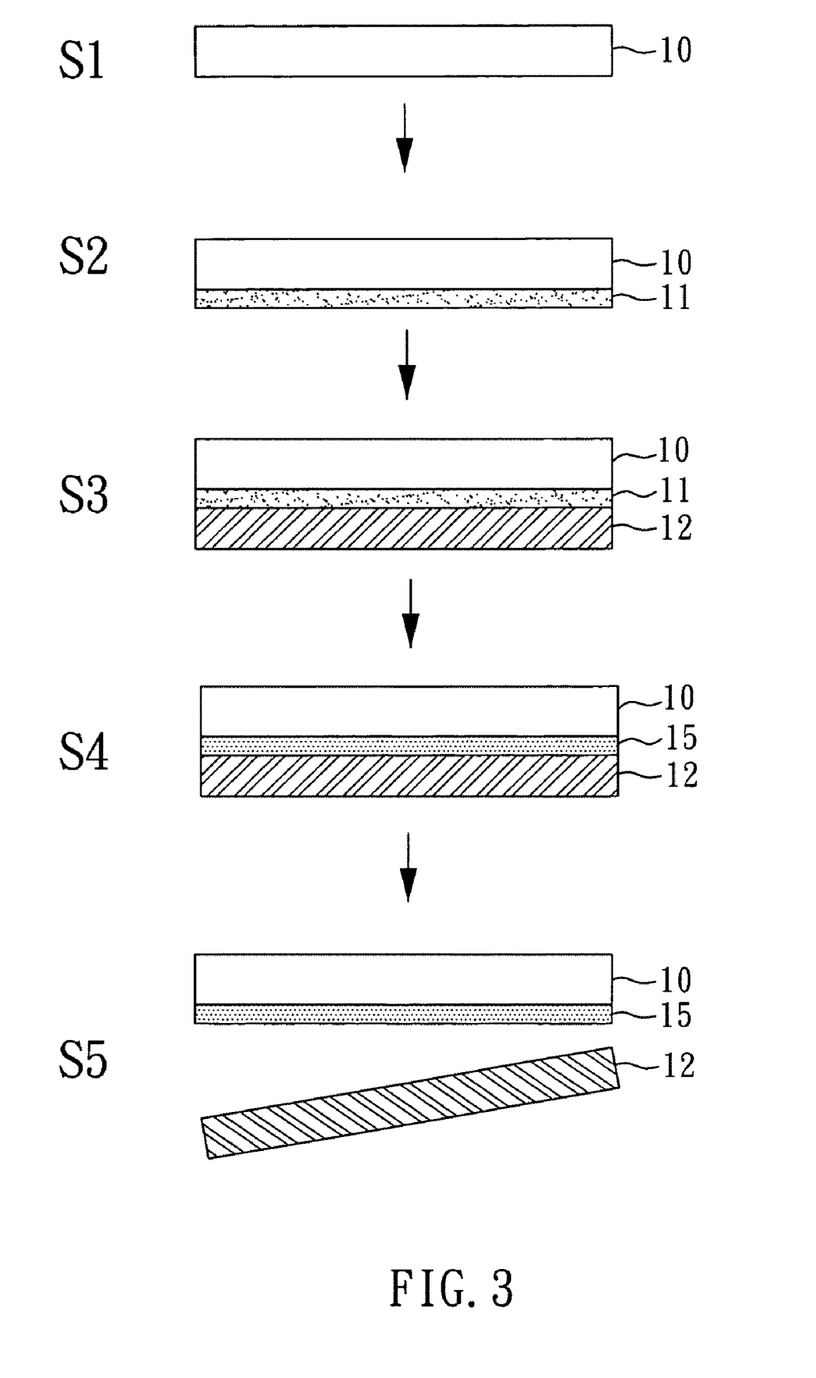
FIG. 3 is the process flow-chart of the method of fabricating a poly-Si layer in Example 2.

With reference to FIG. 3, the process flow-chart of the present example is indicated. The method of fabricating the poly-Si layer 15 is the same as that in Example 1, except that the amorphous-Si layer 11 is formed at the down-side surface of the glass substrate 10 in the step S2.

Example 3

Figure 4:
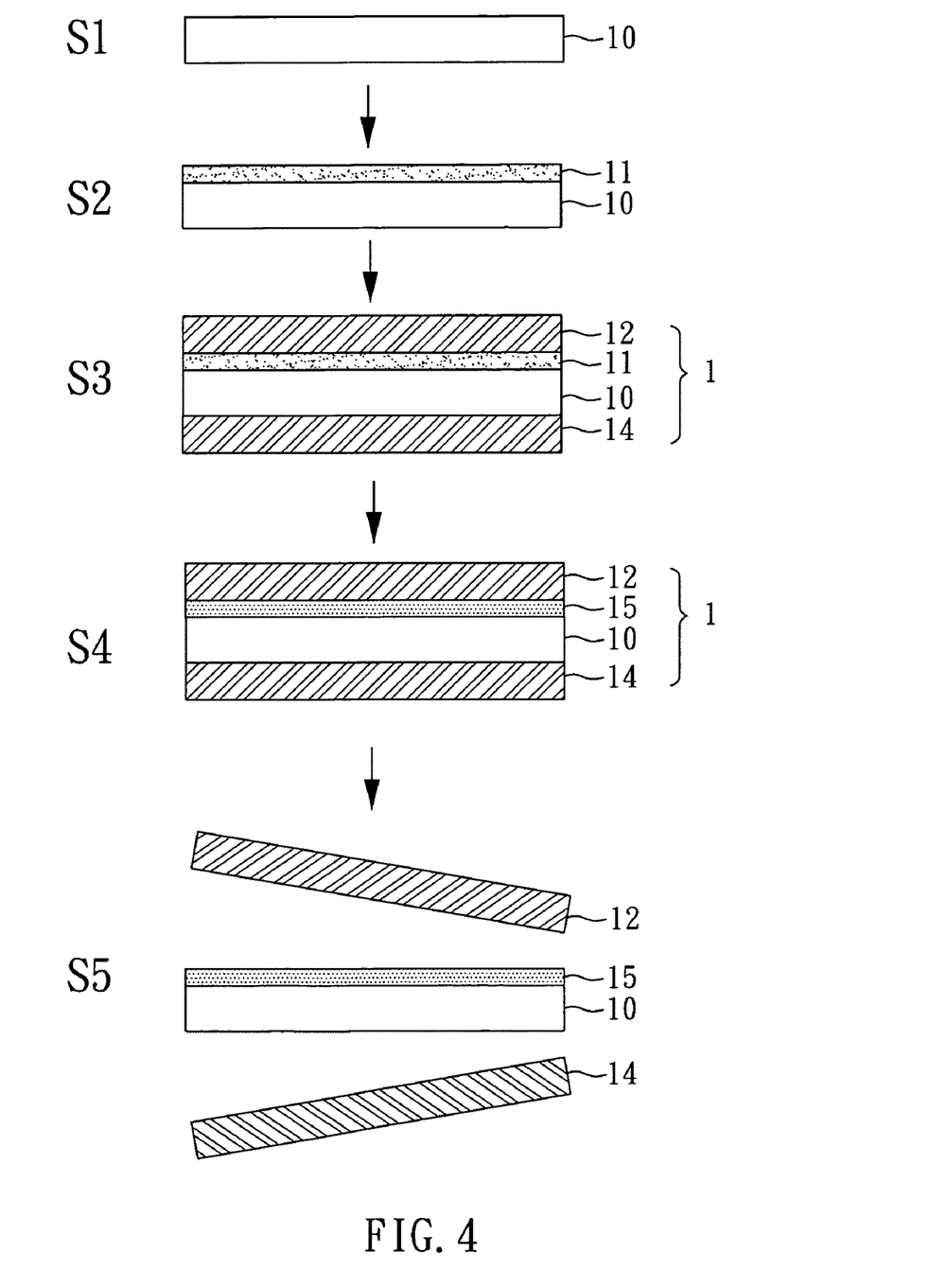
FIG. 4 is the process flow-chart of the method of fabricating a poly-Si layer in Example 3.

FIG. 4 indicates the process flow-chart of the method of fabricating a poly-Si layer of the present example. The method comprises: forming an amorphous-Si layer 11 on a glass substrate 10; attaching two metal plates 12, 14 to the two sides of the amorphous-Si layer 11 and the glass substrate 10 respectively, thus a stack 1 is formed (S3); then, placing the stack 1 into a Rapid Thermal Annealing (RTA) system (not shown), illuminating with infrared light to obtain rapid heating (at 700° C., 46 seconds), followed with annealing (S4) to make the amorphous-Si layer 11 crystallized to form a poly-Si layer 15; finally, the metal plates 12, 14 are removed from the stack 1 to get the poly-Si layer 15 (S5).

Example 4

Figure 5:
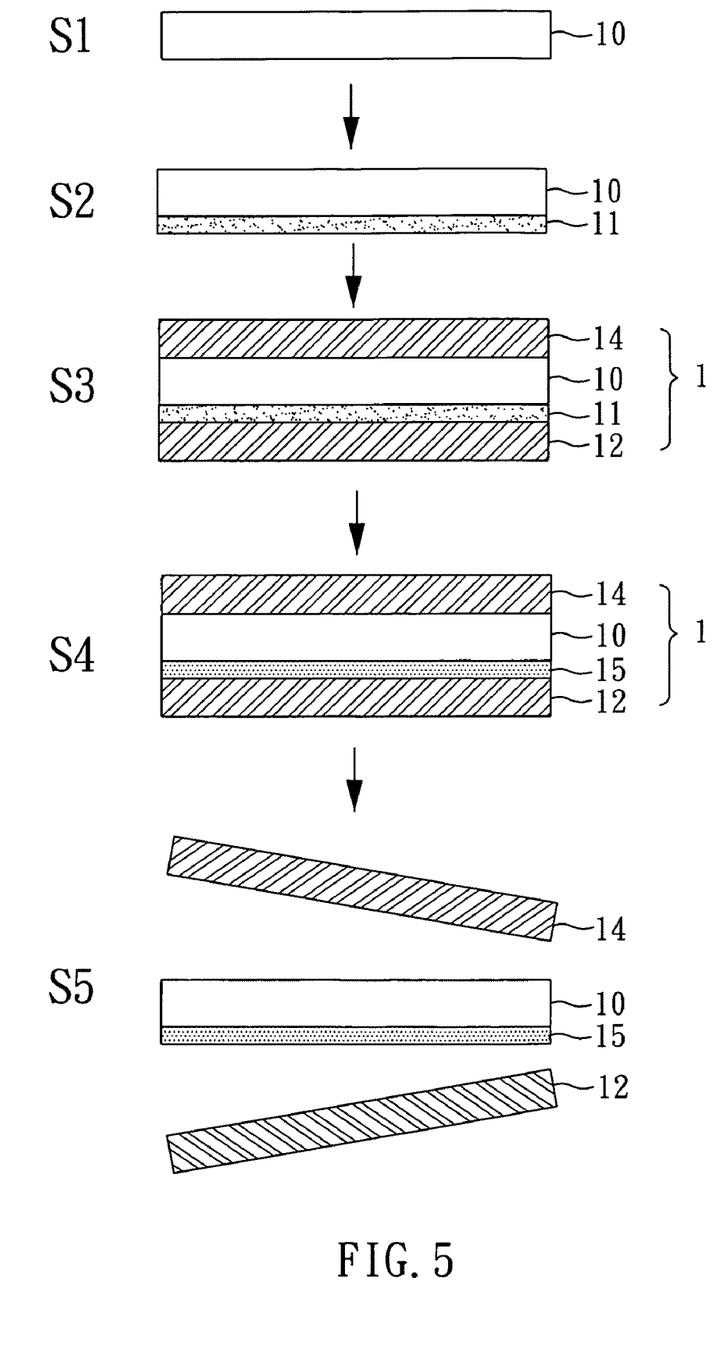
FIG. 5 is the process flow-chart of the method of fabricating a poly-Si layer in Example 4.

With reference to FIG. 5, the process flow-chart of the present example is indicated. The method of fabricating the poly-Si layer 15 is the same as that in Example 3, except that the amorphous-Si layer 11 is formed at the down-side surface of the glass substrate 10 in the step S2.

Example 5

Figure 6:
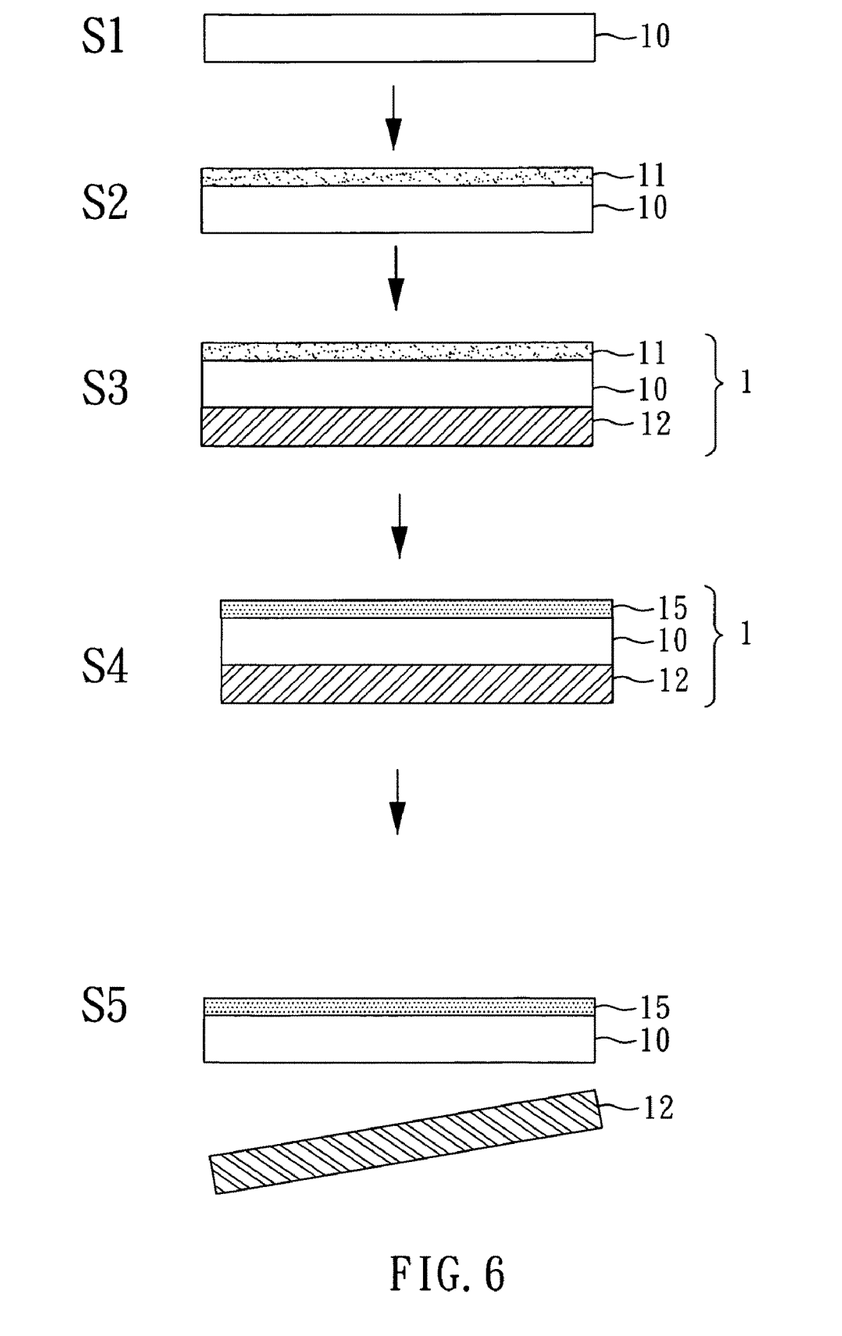
FIG. 6 is the process flow-chart of the method of fabricating a poly-Si layer in Example 5.

Referring to FIG. 6, which indicates the process flow-chart of the present example, first, an amorphous-Si layer 11 is formed on the glass substrate 10 (S2), a metal plate 12 is then applied (attached) on the side of the glass substrate 10 to form a stack 1 (S3). Then, the whole stack 1 is placed into a Rapid Thermal Annealing (RTA) system (not shown) and illuminated with infrared light to obtain rapid heating (at 900° C., 106 seconds), and followed with annealing (S4). Therefore, the amorphous-Si layer 11 is crystallized into a poly-Si layer 15. Finally, the metal plate 12 is removed to get the poly-Si layer 15 (S5).

Example 6

Figure 7:
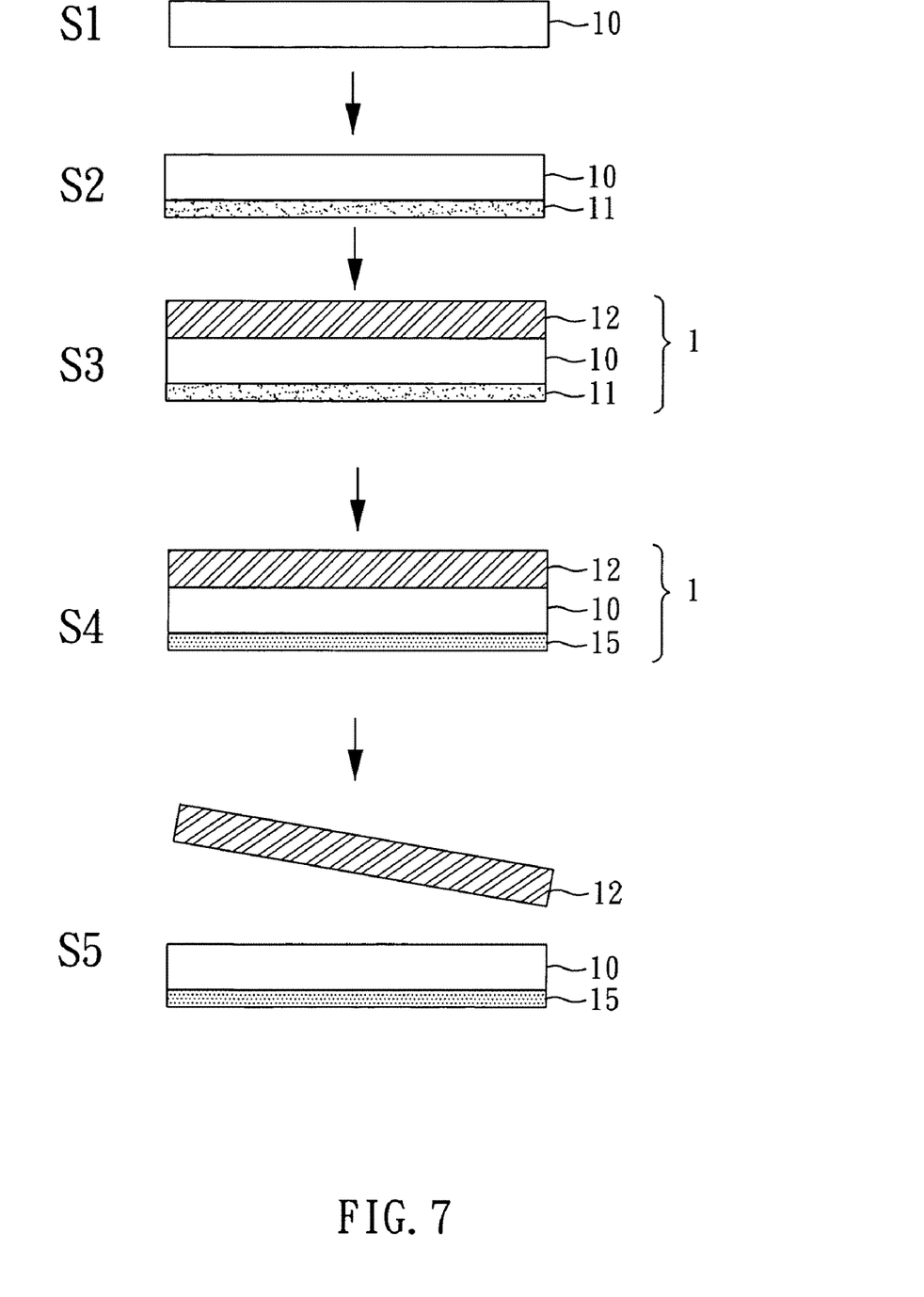
FIG. 7 is the process flow-chart of the method of fabricating a poly-Si layer in Example 6.
Figure 8A:
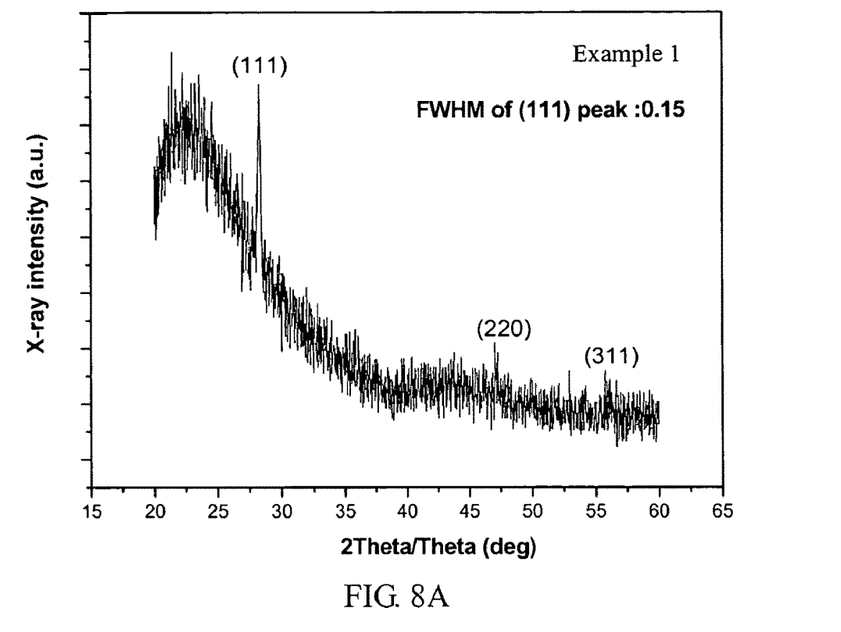
FIGS. 8A-8E are X-ray diffraction analysis results of poly-Si layers from Examples 1-5 respectively.
Figure 8B:
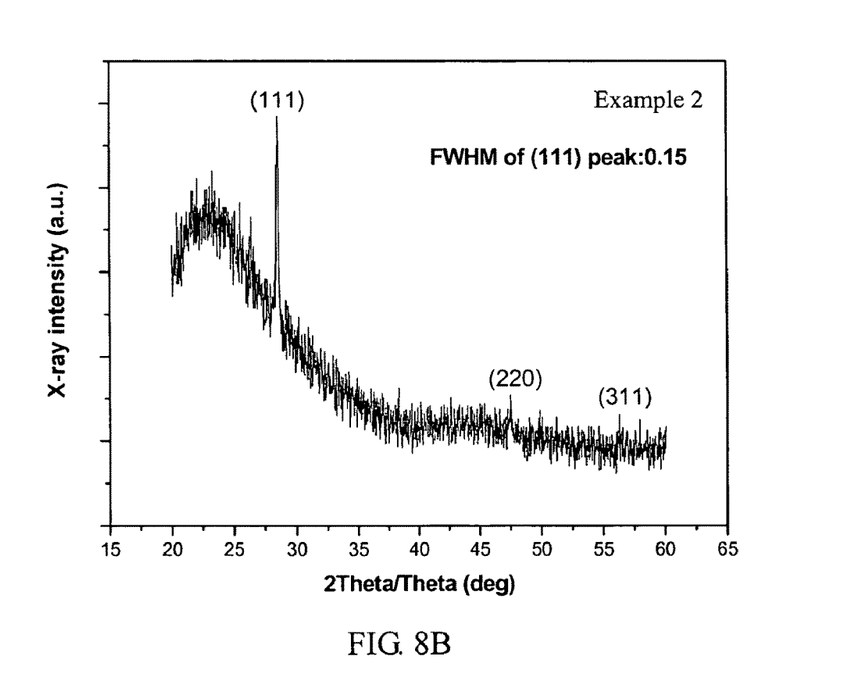
Figure 8C:
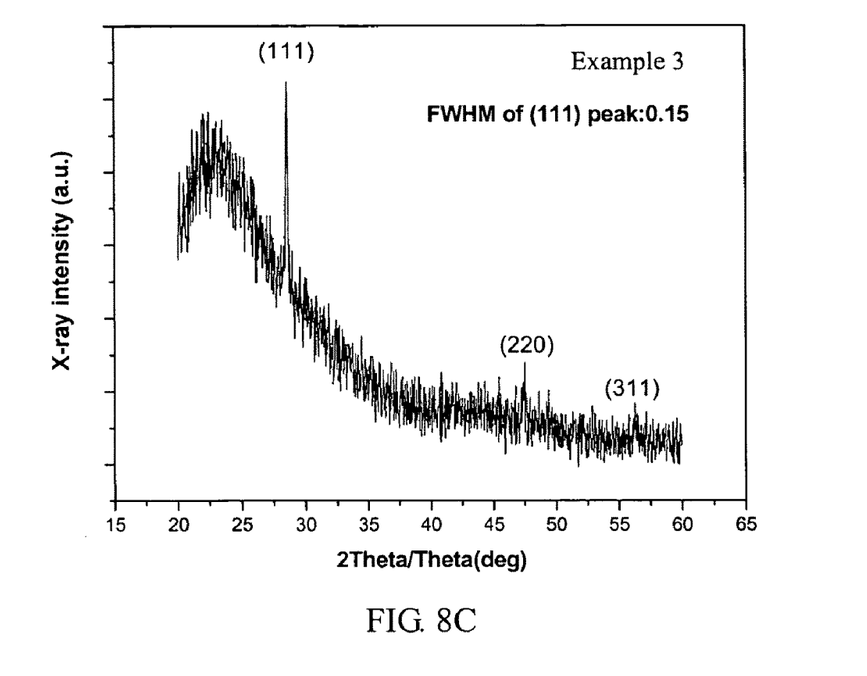
Figure 8D:
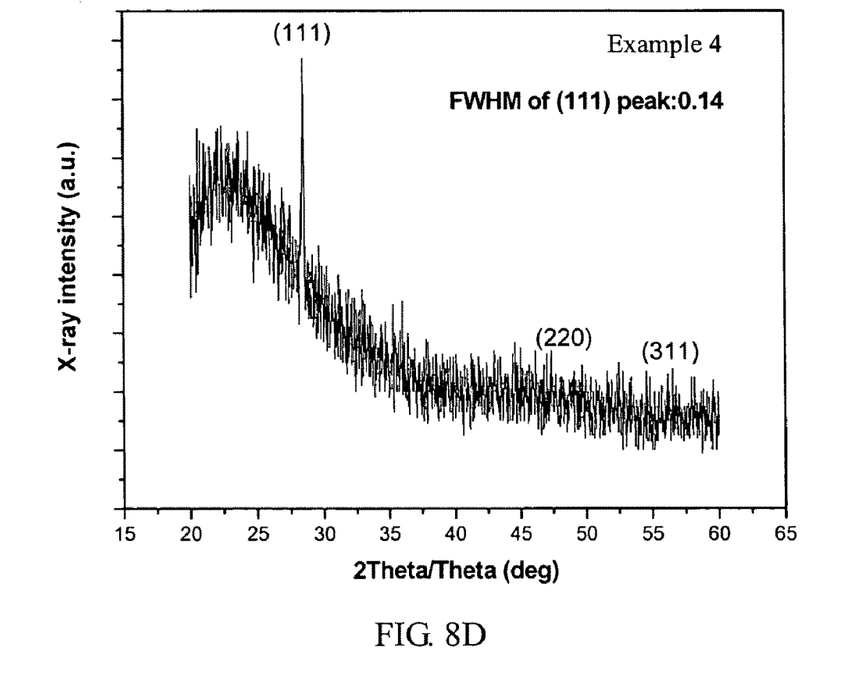
Figure 8E:
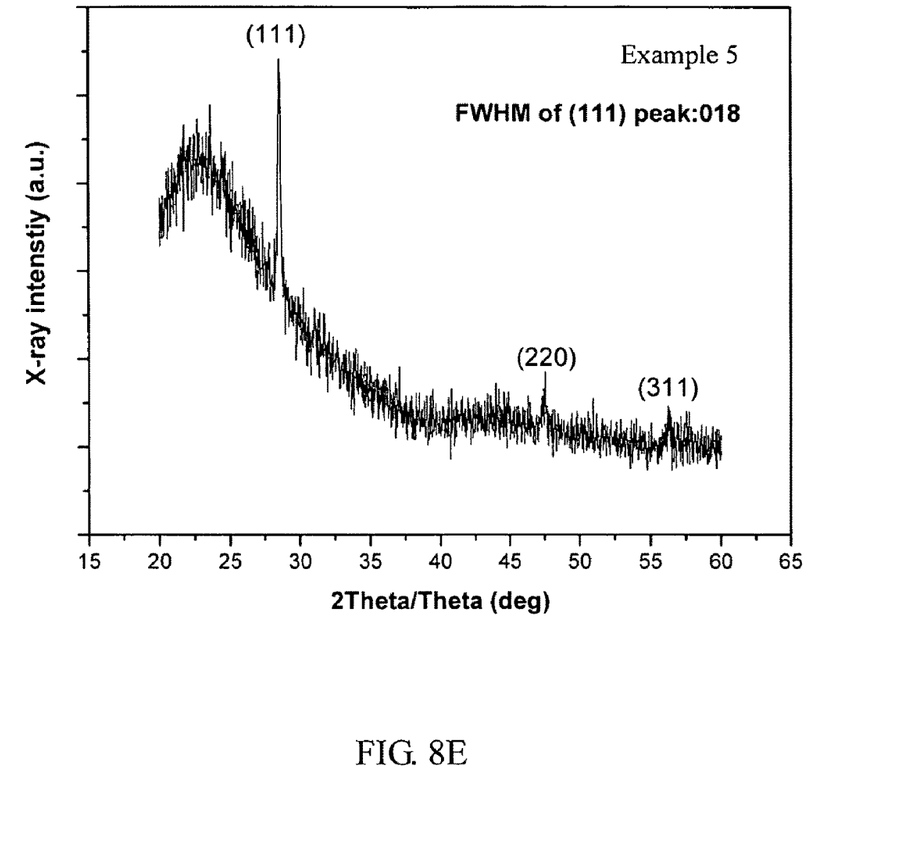
Figure 9A:
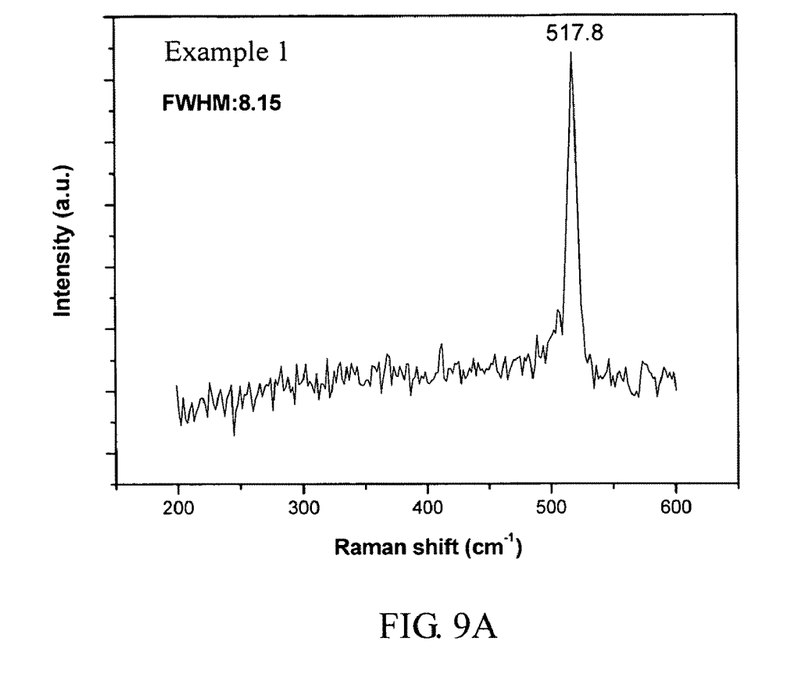
FIGS. 9A-9E are Raman scattering spectroscopy analysis results of poly-Si layers from Examples 1-5 respectively.
Figure 9B:
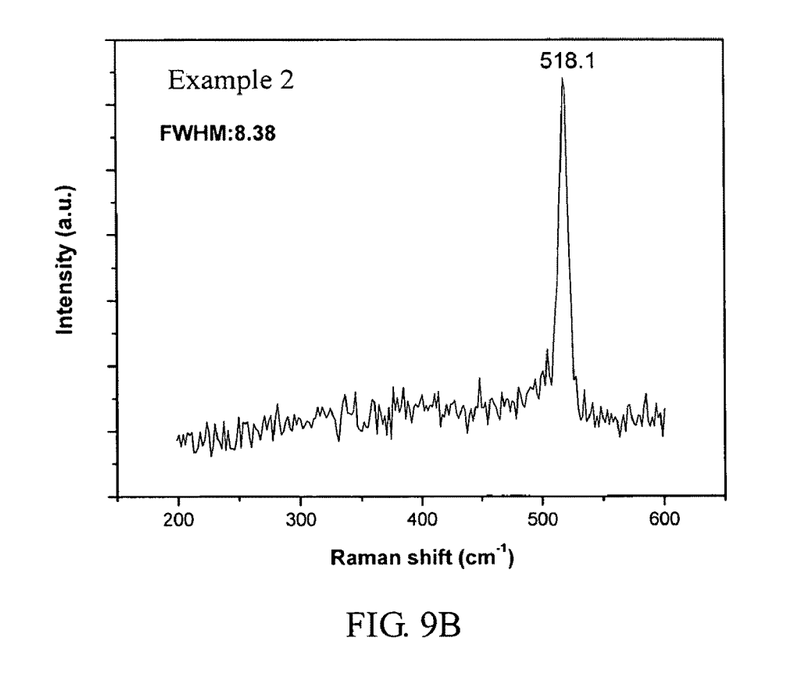
Figure 9C:
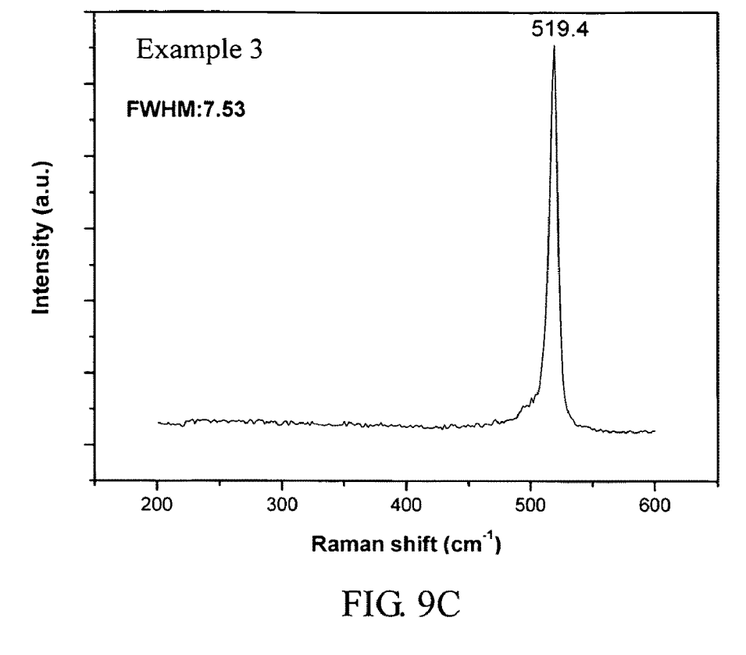
Figure 9D:
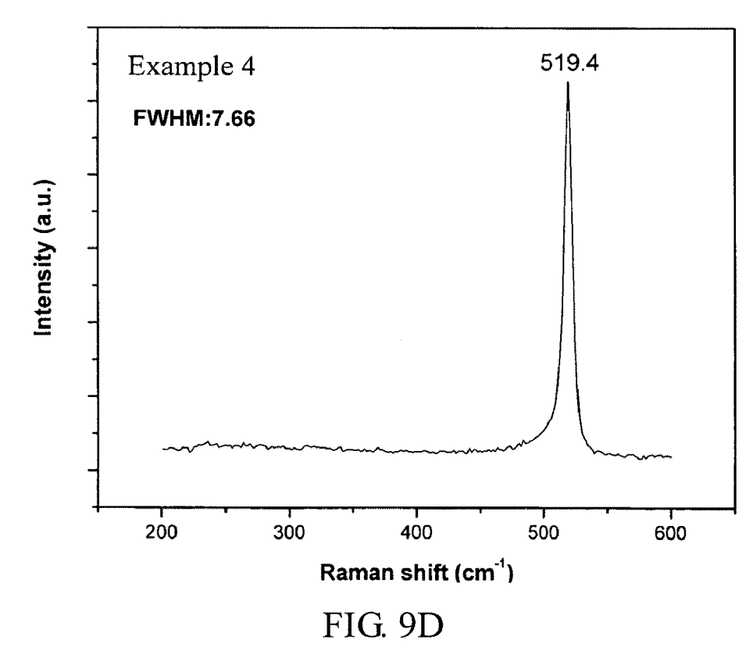
Figure 9E:
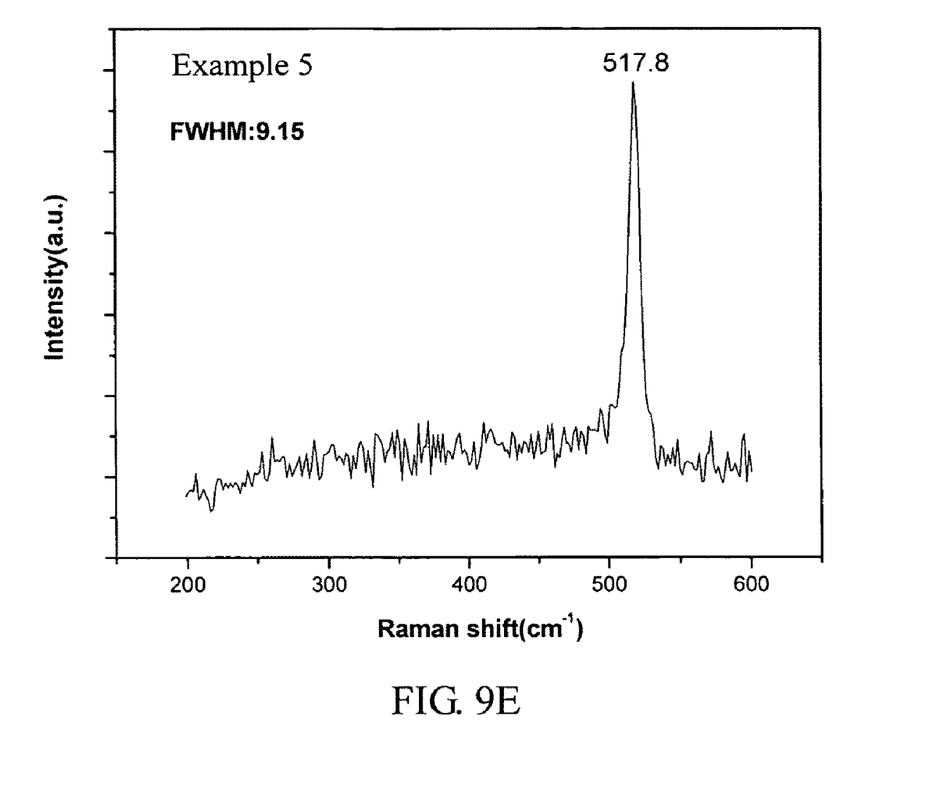

Referring to FIG. 7, which indicates the process flow-chart of the present example, first, an amorphous-Si layer 11 is formed at the down-side surface of the glass substrate 10 (S2), a metal plate 12 is then applied (attached) on the side of the glass substrate 10 to form a stack 1 (S3). Then, the whole stack 1 is placed into a Rapid Thermal Annealing (RTA) system (not shown) and illuminated with infrared light to obtain rapid heating, and followed with annealing (S4). Therefore, the amorphous-Si layer 11 is crystallized into a poly-Si layer 15. Finally, the metal plate 12 is removed to get the poly-Si layer 15 (S5).

Experiment Example 1

X-Ray Diffraction Analysis

The poly-Si layers obtained from Examples 1-5 are applied into X-ray diffraction analysis, crystallinity of each poly-Si layer is then observed. The measuring results are as shown in FIGS. 8A-8E respectively.

It can be seen that, from the appearance of peak (111), all poly-Si layers of the Examples 1-5 according to the present invention have good crystallinity. More particularly, poly-Si layers of Example 3 and 4 exhibit better crystallinity than Example 1 and 2 while each peak (111) of Example 3 and 4 is sharp and the others are broad. That is, the applying of two metal plates attached to the stack improves the crystallinity of poly-Si layers. The peak (111) appearance in FIG. 8E of Example 5 means the formation of crystal, although the metal plate is attached to the glass side instead of the amorphous-Si layer. That is, even though the metal plate is attached to the glass side, the crystallization still occurs efficiently.

Experiment Example 2

Raman Scattering Spectroscopy (Rs) Analysis

The poly-Si layers obtained from Examples 1-5 are applied into Raman scattering spectroscopy analysis, crystallinity of each poly-Si layer is then observed. The measuring result is as shown in FIGS. 9A-9E.

Based on the standard peak 520 cm$^{-1}$ of a silicon single crystal (as a reference), peaks measured from the poly-Si layer of Example 1-5 are all very close to the peak 520 cm$^{-1}$, particularly the peaks measured from the poly-Si layer made with two metal plates of Examples 3, 4 (FIGS. 9C and 9D) are closer to 520 cm$^{-1}$ (519.4 cm$^{-1}$ for both). This means the crystallinity of the poly-Si layer of Examples 3, 4 is better. Besides, as can be seen from the FWHM (full width at half maximum, which is the smaller, the better the crystallinity) result, the poly-Si layer made with two metal plates has better crystallinity than the others.

Experiment Example 3

Scanning Electron Microscope (SEM) Analysis

The crystal size and shape of each poly-Si layer relate much to their electrical property and resistance. To have a poly-Si layer with excellent electrical property, the grain sizes of the poly-Si layer are as the larger the better. With the traditional method of fabricating a poly-Si layer, the grain-size of the poly-Si layer obtained is about 1000 Å~200 Å.

Poly-Si layers obtained from Examples 1-5 are applied into SEM analysis, the crystal grain size and shape of each poly-Si layer are then observed. The measuring result is as shown in FIGS. 10A-10E.

Figure 10A:
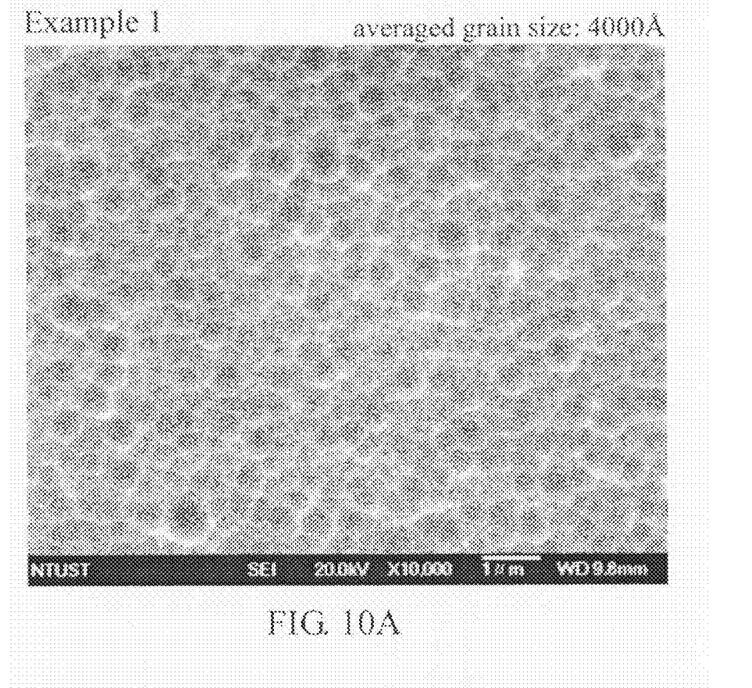
FIGS. 10A-10E are SEM (scanning electron microscope) analysis results of poly-Si layers from Examples 1-5 respectively.
Figure 10B:
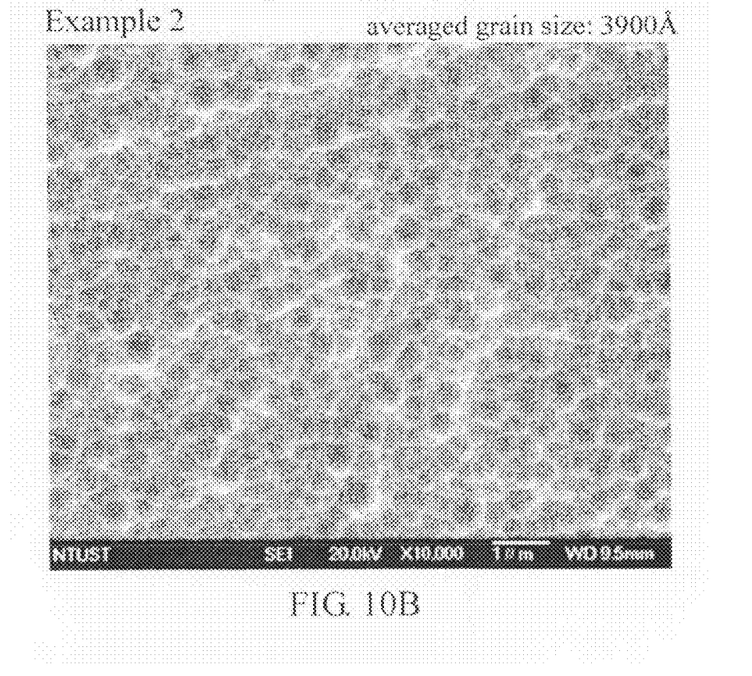
Figure 10C:
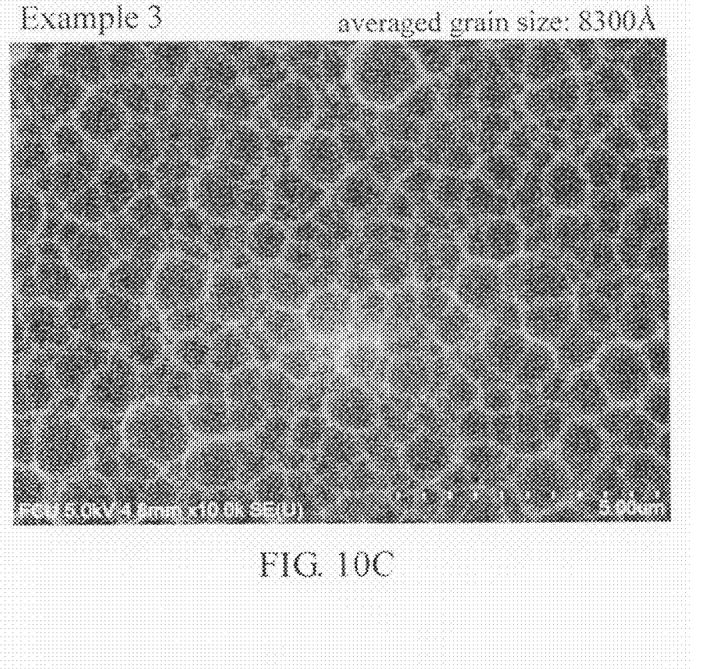
Figure 10D:
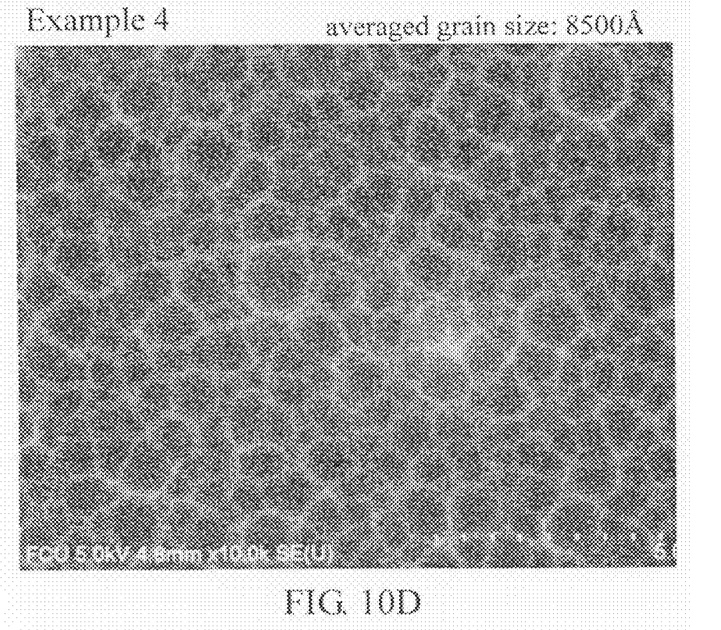
Figure 10E:
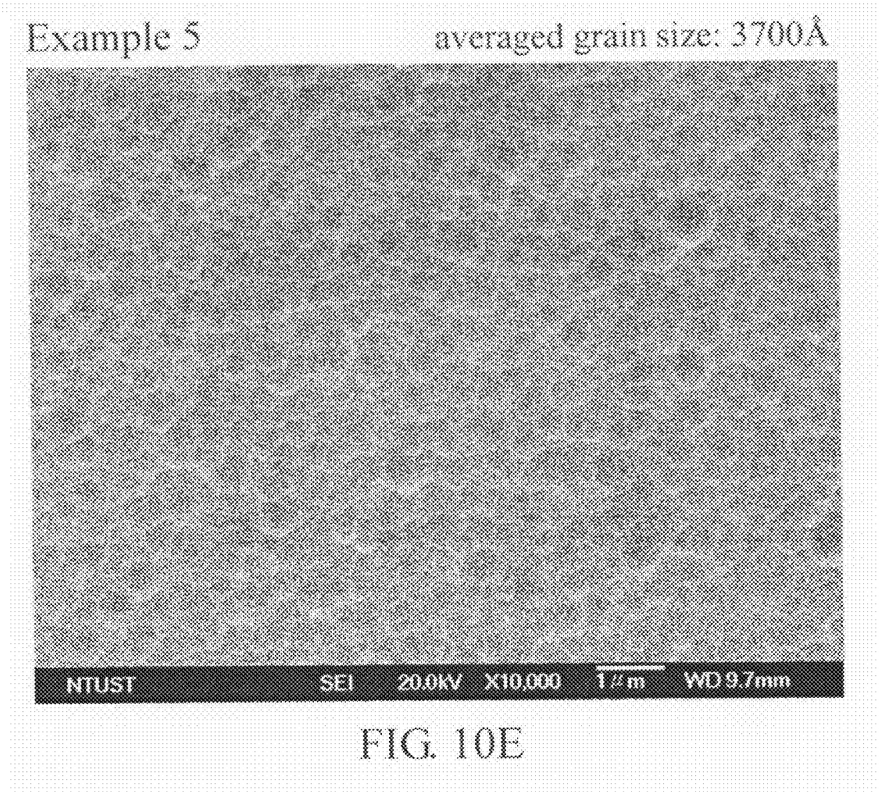

With reference to FIGS. 10A, 10B and 10E, the averaged grain sizes of the poly-Si layers made with a single metal plate by Examples 1, 2 and 5 are 4000 Å, 3900 Å and 3700 Å respectively. Therefore, the averaged grain sizes of the poly-Si layers made with two metal plates (by Examples 3 and 4, FIGS. 10C and 10D) are up to 8300 Å and 8500 Å respectively. That is, the poly-Si layers made from the method of the present invention have excellent averaged grain sizes. Moreover, the application of two metal plates is better than a single metal plate during the process of providing poly-Si layers.

As mentioned above, the method of providing poly-Si layers of the present invention uses metal plates as a heat conductor, when applying Rapid Thermal Annealing (RTA), so as to meet the requirement for rapid poly-Si layer formation (under 106 seconds). The poly-Si layer obtained has good crystallinity, and also has large grain size. The method of the present invention shortens the time used in high temperature processes, which is usually very long in the prior art. Also, the substrate material varies (many kinds of materials can be used) due to the short time process of high temperature, and the substrate material is not limited to materials having long time heat-resistance (for example, quartz). Besides, the poly-Si layer of the present invention has excellent crystallinity and grain-size, thus it is economical and practical for the providing of a poly-Si layer.

Although the present invention has been explained in relation to its preferred embodiment, it is to be understood that many other possible modifications and variations can be made without departing from the spirit and scope of the invention as hereinafter claimed.

What is claimed is:

1. A method of providing a polysilicon layer, which comprises sequentially:
   (A) providing a substrate;
   (B) forming an amorphous silicon layer on a surface of the substrate;
   (C) providing at least one metal plate separate from said substrate;
   (D) attaching said separate at least one metal plate on top of the amorphous silicon layer or on top of the substrate, thus forming a stack, said at least one metal plate covering at least one surface of said stack;
   (E) light-illuminating to the stack while the metal plate covers said surface, thus converting the amorphous silicon layer to the polysilicon layer; and
   (F) thereafter mechanically removing the metal plate;
   wherein, a Rapid Thermal Annealing (RTA) process is applied in the light-illuminating process of the step (E) in said removal of the plate.

2. The method of providing a poly-Si layer as claimed in claim 1, wherein the at least one metal plate in step (D) is attached to the surface of the amorphous-Si layer.

3. The method of providing a poly-Si layer as claimed in claim 1, wherein the at least one metal plate in step (D) is attached to the surface of the substrate.

4. The method of providing a poly-Si layer as claimed in claim 1, wherein the at least one metal plate in step (D) is attached to the surface of each of the amorphous silicon layer and the surface of the substrate.

5. The method of providing a polysilicon layer as claimed in claim 1, wherein an infrared light or an ultraviolet light is applied in the Rapid Thermal Annealing (RTA) process.

6. The method of providing a poly-Si layer as claimed in claim 1, wherein the time of light-illuminating in step (E) is less than 120 seconds.

7. The method of providing a poly-Si layer as claimed in claim 1, wherein the temperature of light-illuminating in step (E) is at 400-1100° C.

8. The method of providing a poly-Si layer as claimed in claim 1, wherein the material of the metal plate is selected from a group consisting of: Al, Fe, Cu, Ag, Mn, Co, Ni, Au, Zn, Sn, In, Cr, Pt, W, and the alloy thereof.

9. The method of providing a poly-Si layer as claimed in claim 1, wherein the materials of the substrate is glass, plastic or other flexible material.

10. The method of providing a polysilicon layer as claimed in claim 1, wherein the metal plate covers all of said surface of said stack before applying the Rapid Thermal Annealing process.

* * * * *